(12) United States Patent
Radosavljevic et al.

(10) Patent No.: US 7,751,160 B1
(45) Date of Patent: Jul. 6, 2010

(54) PROTECTIVE DEVICE WITH SEPARATE END-OF-LIFE TRIP MECHANISM

(75) Inventors: Dejan Radosavljevic, La Fayette, NY (US); Jeffrey C. Richards, Baldwinsville, NY (US); Kent Morgan, Groton, NY (US); David A. Finlay, Sr., Marietta, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 676 days.

(21) Appl. No.: 11/256,703

(22) Filed: Oct. 24, 2005

Related U.S. Application Data

(63) Continuation-in-part of application No. 11/025,509, filed on Dec. 29, 2004, now abandoned, and a continuation-in-part of application No. 10/900,769, filed on Jul. 28, 2004, now Pat. No. 7,154,718, and a continuation-in-part of application No. 10/942,633, filed on Sep. 16, 2004, now Pat. No. 7,173,799.

(51) Int. Cl.
*H02H 3/00* (2006.01)
*H02H 3/16* (2006.01)
*G01R 31/02* (2006.01)

(52) U.S. Cl. .......................... 361/42; 361/45; 324/509; 324/424

(58) Field of Classification Search .................. 361/42, 361/45; 324/509, 424
See application file for complete search history.

(56) References Cited

U.S. PATENT DOCUMENTS

| | | | |
|---|---|---|---|
| 6,002,565 A | 12/1999 | Ronisch | |
| 6,262,871 B1 | 7/2001 | Nemir | |
| 6,487,057 B1 | 11/2002 | Natili | |
| 6,670,870 B2 * | 12/2003 | Macbeth | 335/6 |
| 6,674,289 B2 * | 1/2004 | Macbeth | 324/509 |
| 6,697,238 B2 | 2/2004 | Bonilla | |
| 6,724,591 B2 | 4/2004 | Clarey et al. | |
| 6,804,094 B2 | 10/2004 | Kampmeyer | |
| 6,831,819 B2 | 12/2004 | Nemir et al. | |
| 6,856,498 B1 * | 2/2005 | Finlay, Sr. | 361/42 |
| 6,873,158 B2 * | 3/2005 | Macbeth | 324/509 |
| 6,952,150 B2 * | 10/2005 | Radosavljevic et al. | 335/18 |
| 6,980,005 B2 * | 12/2005 | Finlay et al. | 324/424 |
| 7,253,629 B1 * | 8/2007 | Richards et al. | 324/424 |

(Continued)

*Primary Examiner*—Stephen W Jackson
*Assistant Examiner*—Zeev Kitov
(74) *Attorney, Agent, or Firm*—Daniel P. Malley; Bond, Schoeneck & King, PLLC

(57) ABSTRACT

The present invention is directed to a protective wiring device for use in an electrical distribution system. The device includes a plurality of line terminals and a plurality of load terminals configured to be coupled to the plurality of line terminals in a reset state. A detector circuit is coupled to the plurality of line terminals. The detector circuit is configured to generate a detection signal in response to detecting at least one predefined perturbation in the electrical distribution system. A circuit interrupter assembly is coupled between the plurality of line terminals and the plurality of load terminals. The circuit interrupter assembly is configured to decouple the plurality of line terminals from the plurality of load terminals in response to the detection signal. An end-of-life mechanism is coupled to the detector circuit. The end-of-life mechanism is configured to permanently decouple the plurality of line terminals from the plurality of load terminals in the absence of an intervening signal.

34 Claims, 4 Drawing Sheets

U.S. PATENT DOCUMENTS 7,268,559 B1 * 9/2007 Chen et al. .................. 324/527
2001/0033468 A1 * 10/2001 Macbeth ...................... 361/42
2004/0056664 A1 * 3/2004 Macbeth ...................... 324/509
2005/0212522 A1 * 9/2005 Finlay et al. ................ 324/509

* cited by examiner

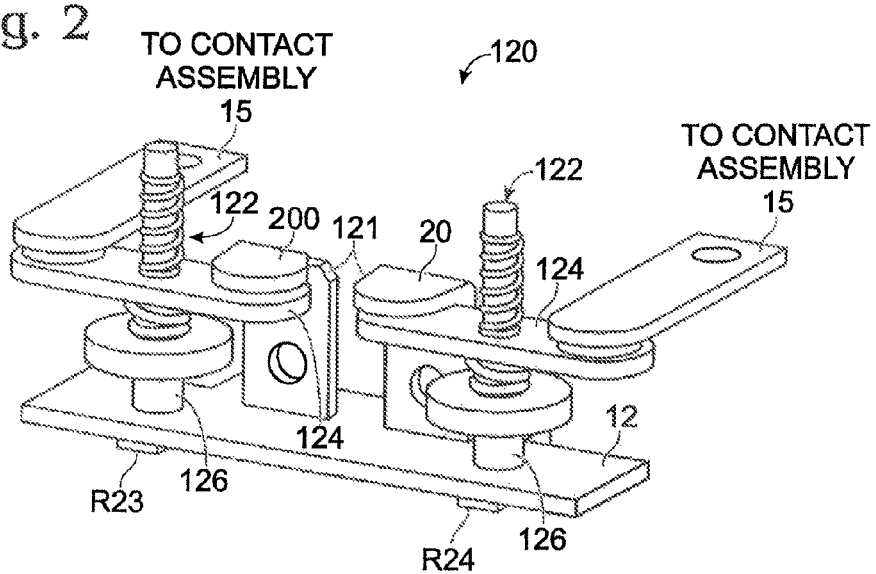
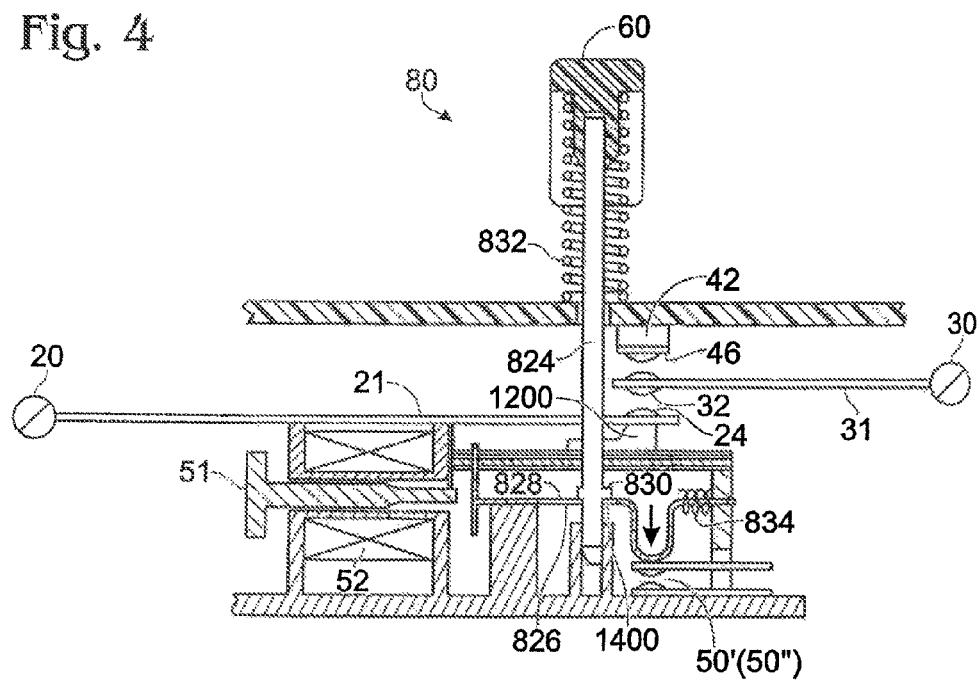

PROTECTIVE DEVICE WITH SEPARATE END-OF-LIFE TRIP MECHANISM

CROSS-REFERENCE TO RELATED APPLICATIONS

This is a continuation-in-part of U.S. patent application Ser. No. 11/025,509 filed on Dec. 29, 2004 now abandoned, U.S. patent application Ser. No. 10/900,769 filed on Jul. 28, 2004 now U.S. Pat. No. 7,154,718, and U.S. patent application Ser. No. 10/942,633 filed on Sep. 16, 2004 now U.S. Pat. No. 7,173,799, the contents of which is relied upon and incorporated herein by reference in their entirety, and the benefit of priority under 35 U.S.C. §120 is hereby claimed.

BACKGROUND OF THE INVENTION

1. Field of the Invention

The present invention relates generally to electrical wiring devices, and particularly to electrical wiring devices having protective features.

2. Technical Background

Examples of electric circuit protection devices include ground fault circuit interrupters (GFCIs), arc fault circuit interrupters (AFCIs), or devices that include both GFCIs and AFCIs in one protective device. An electric circuit typically includes at least one protection device disposed in the breaker box, in a duplex receptacle, in an electrical plug, or the like. The most common fault conditions are ground faults and arc faults. The function of a protection device is to detect the fault and then remove power to the load circuit to substantially eliminate the possibility of shock or fire.

An arc fault is a discharge of electricity between two or more conductors. There are two types of arc faults. One type is a parallel arc fault, and the other is known as a series arc fault. A parallel arc fault is caused by damaged insulation on the hot line conductor or neutral line conductor, or on both the hot line conductor and the neutral line conductor, such as from an overdriven staple. The damaged insulation may cause an arc between the two conductors and may result in a fire. A series arc may be caused by a break in the line or neutral conductors of the electrical distribution system or by a loose wiring device terminal. An arc fault usually manifests itself as a high frequency current signal that typically exhibits a concentration of energy in certain frequency bands. As such, AFCIs may be configured to detect arc faults by being designed to recognize the aforementioned high frequency signature.

A ground fault, on the other hand, is a condition that occurs when a current carrying (hot) conductor contacts ground to create an unintended current path. The unintended current path represents an electrical shock hazard. A ground fault may also represent a fire hazard. A ground fault may occur for several reasons. If the wiring insulation within a load circuit becomes damaged, the hot conductor may contact ground, creating a shock hazard for a user. A ground fault may also occur when equipment comes in contact with water. A ground fault may also be caused by damaged insulation within the facility.

Under normal operating conditions, the current flowing in the hot conductor should equal the current in the neutral conductor. A ground fault upsets this balance and creates a differential current between the hot conductor and the neutral conductor. GFCIs exploit this phenomenon by comparing the current in the hot conductor(s) to the return current in the neutral conductor. In other words, a ground fault is typically detected by sensing the differential current between the two conductors. Upon detecting a ground fault, the GFCI may respond by actuating an alarm and/or interrupting the circuit.

A grounded neutral condition is another type of fault condition that occurs when the load neutral terminal, or a conductor connected to the load neutral terminal, becomes grounded. While this condition does not represent an immediate shock hazard, it is nonetheless an insidious double-fault condition that may lead to a serious injury or a fatality. The reasons for this become apparent when one considers that GFCIs are configured to trip when the differential current is greater than or equal to approximately 6 mA. However, when the load neutral conductor is grounded the GFCI becomes de-sensitized because some of the return path current is diverted to ground. Under these conditions, it may take up to 30 mA of differential current before the GFCI trips. Accordingly, when a fault occurs in a grounded neutral state, the GFCI may fail to trip, exposing a user to experience serious injury or death. There are other reasons why a protective device may fail to perform its function.

The protective device includes electronic and mechanical components that may experience an end-of-life (EOL) condition. For example, protective devices must include some type of fault sensor and detector. The detector output is coupled to an electronic switch. When the switch is turned ON a solenoid is energized. The energized solenoid drives a circuit interrupter in turn. Of course, the circuit interrupter disconnects the load terminals from the line terminals when a fault is detected. Component failure may occur for a variety of reasons. Failure may occur because of the normal aging of electronic components. Mechanical parts may become corroded, experience mechanical wear, or fail because of mechanical abuse. Devices may also fail when they are overloaded when installed. Electrical power surges, such as from lightning, also may result in failure. If any of the sensor, the detector, the switch, solenoid, and/or power supply fail, i.e., an EOL condition is extant, the GFCI may fail to trip, exposing a user to experience serious injury or death. There are other reasons why a protective device may fail to perform its function. Accordingly, a protection device that denies power to a load circuit in the event of an EOL condition is desirable.

In one approach that has been considered, a protective device is equipped with a manually activated test button for determining the operating condition of the device. If the test fails the circuit interrupter permanently disconnects the load terminals from the line terminals. One drawback to this approach relates to the fact that the device only reacts to a problem if the user activates the test button. As such, this approach does not address the aforementioned EOL scenario. Another drawback to this relates to the fact that even if the device is manually tested, an inoperative circuit interrupter allows a fire or shock hazard to persist indefinitely.

In another approach that has been considered, a protective device may be equipped with an automatic test feature. In this approach, the automatic test mechanism periodically tests the device without user intervention. A failed test automatically causes the circuit interrupter to permanently disconnect the load terminals from the line terminals. The drawback to this approach is similar to the manual approach described above. The auto-test device also provides unprotected power to the load circuit when the circuit interrupter is experiencing an EOL condition.

Accordingly, a protective device is needed having a test feature for detecting failure of both electrical components and electro-mechanical components. Further, what is needed is a device having a separate test mechanism configured to deny power to a load circuit in response to the aforementioned EOL conditions.

SUMMARY OF THE INVENTION

The present invention addresses the needs described above. As such, the present invention is directed to a protective device that has a test feature for detecting failure of both electrical components and electro-mechanical components. The protective device of the present invention also includes a separate test mechanism configured to deny power to a load circuit in response to the aforementioned EOL conditions.

One aspect of the present invention is directed to a protective wiring device for use in an electrical distribution system. The device includes a plurality of line terminals and a plurality of load terminals configured to be coupled to the plurality of line terminals in a reset state. A detector circuit is coupled to the plurality of line terminals. The detector circuit is configured to generate a detection signal in response to detecting at least one predefined perturbation in the electrical distribution system. A circuit interrupter assembly is coupled between the plurality of line terminals and the plurality of load terminals. The circuit interrupter assembly is configured to decouple the plurality of line terminals from the plurality of load terminals in response to the detection signal. An end-of-life mechanism is coupled to the detector circuit. The end-of-life mechanism is configured to permanently decouple the plurality of line terminals from the plurality of load terminals in the absence of an intervening signal.

In another aspect, the present invention is directed to a protective wiring device for use in an electrical distribution system. The device includes at least one line terminal and at least one load terminal configured to be coupled to the at least one line terminal in a reset state. A detector circuit is coupled to the at least one line terminal. The detector circuit is configured to generate a detection signal in response to detecting at least one predefined perturbation in the electrical distribution system. A circuit interrupter assembly is coupled between the at least one line terminal and the at least one load terminal. The circuit interrupter assembly is configured to decouple the at least one line terminal from the at least one load terminal in response to the detection signal. An end-of-life mechanism is coupled to the detector circuit. The end-of-life mechanism is configured to permanently decouple the at least one line terminal from the at least one load terminal in the absence of an intervening signal. A test circuit is coupled to the detector circuit, the test circuit being configured to generate a test signal. The test signal simulates the at least one predefined perturbation A checking circuit is coupled to the detector circuit. The checking circuit is configured to generate the intervening signal in response to the detection signal.

In yet another aspect, the present invention is directed to a protective wiring device for use in an electrical distribution system. The device includes at least one line terminal and at least one load terminal configured to be coupled to the at least one line terminal in a reset state. A detector circuit is coupled to the at least one line terminal. The detector circuit is configured to generate a detection signal in response to detecting at least one predefined perturbation in the electrical distribution system. A circuit interrupter assembly is coupled between the at least one line terminal and the at least one load terminal. The circuit interrupter assembly is configured to decouple the at least one line terminal from the at least one load terminal in response to the detection signal. A test circuit is coupled to the detector circuit, the test circuit being configured to generate a test signal. The test signal simulates the at least one predefined perturbation. A circuit element is coupled between the end-of-life mechanism and the at least one load terminal. The circuit element is configured to transmit the intervening signal from the at least one load terminal to the end-of-life mechanism. The intervening signal is substantially equal to zero volts.

In yet another aspect, the present invention is directed to a protective wiring device for use in an electrical distribution system. The device includes at least one line terminal and at least one load terminal configured to be coupled to the at least one line terminal in a reset state. A detector circuit is coupled to the at least one line terminal. The detector circuit is configured to generate a detection signal in response to detecting at least one predefined perturbation in the electrical distribution system. A circuit interrupter assembly is coupled between the at least one line terminal and the at least one load terminal. The circuit interrupter assembly is configured to decouple the at least one line terminal from the at least one load terminal in response to the detection signal. A test circuit is coupled to the detector circuit, the test circuit being configured to generate a test signal. The test signal simulates the at least one predefined perturbation. A unitary user input mechanism is coupled to the test circuit. The unitary user input mechanism is configured to generate the actuation signal in response to a user stimulus and reset the circuit interrupter assembly in response to a removal of the user stimulus if the circuit interrupter is in a tripped state. The tripped state being indicative of the intervening signal.

In yet another aspect, the present invention is directed to a protective wiring device for use in an electrical distribution system. The device includes at least one line terminal and at least one load terminal configured to be coupled to the at least one line terminal in a reset state. A detector circuit is coupled to the at least one line terminal. The detector circuit is configured to generate a detection signal in response to detecting at least one predefined perturbation in the electrical distribution system. A circuit interrupter assembly is coupled between the at least one line terminal and the at least one load terminal. The circuit interrupter assembly is configured to decouple the at least one line terminal from the at least one load terminal in response to the detection signal. An end-of-life mechanism is coupled to the detector circuit. The end-of-life mechanism is configured to permanently decouple the plurality of line terminals from the plurality of load terminals in the absence of an intervening signal. A user actuated test mechanism is configured to generate a test signal in response to a user stimulus. The test signal simulates the detection signal, whereby the circuit interrupter assembly is tripped in response thereto if the device is operational, a tripped state being indicative of the intervening signal.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 2 is a detailed perspective view of an end-of-life mechanism employed in the electrical device depicted FIG. 1;

FIG. 4 is a detail view of a latch mechanism in accordance with the present invention;

DETAILED DESCRIPTION

Figure 1:
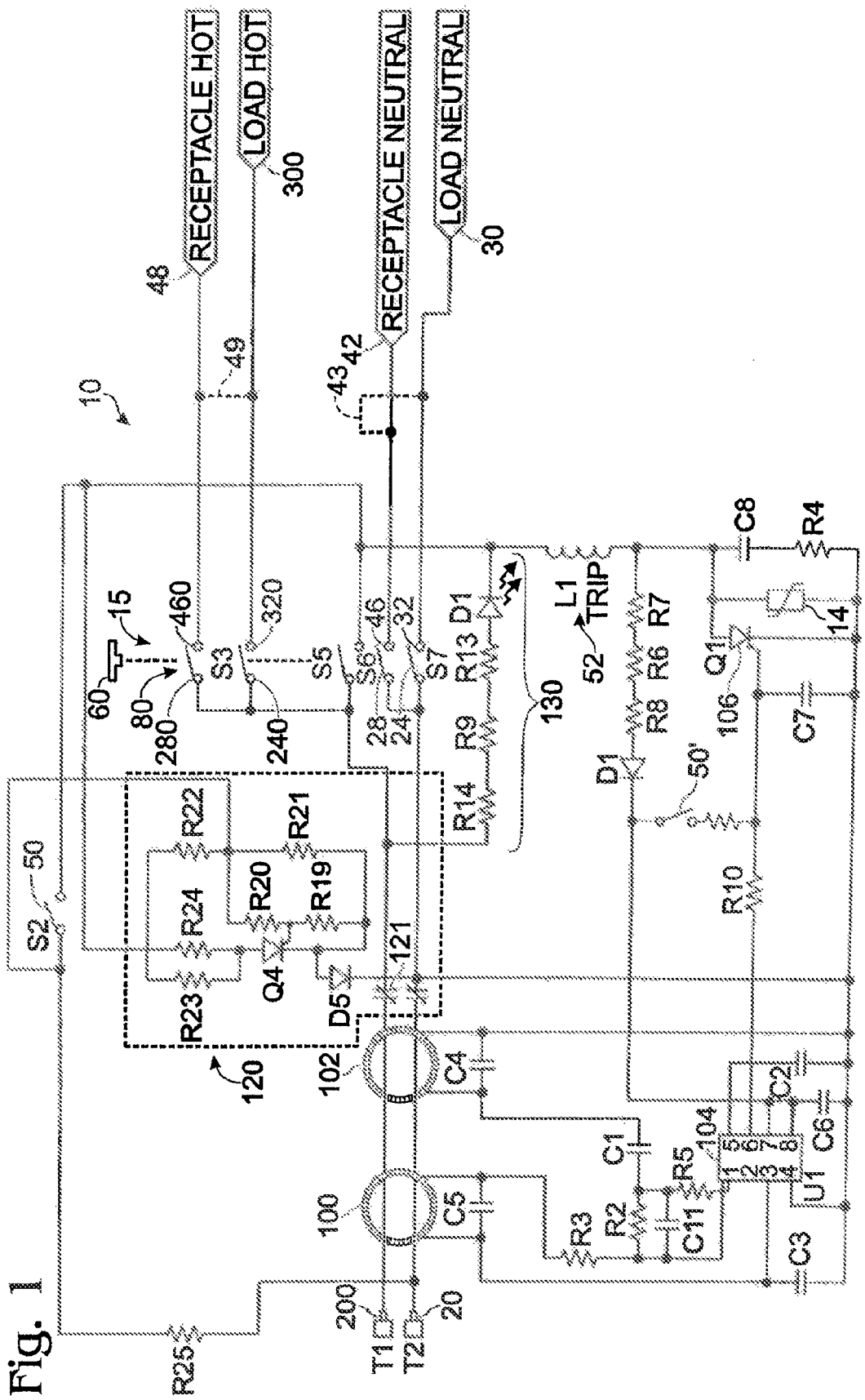
FIG. 1 is a schematic of the electrical device in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protective device of the present invention is shown in FIG. 1, and is designated generally throughout by reference numeral 10.

As embodied herein, and depicted in FIG. 1, a schematic of the electrical device 10 in accordance with one embodiment of the present invention is shown. While the schematic in FIG. 1 is directed to a GFCI, the present invention is equally applicable to AFCIs and/or other such protective devices.

Device 10 includes hot line contact 200 and neutral line contact 20 coupled to ground fault sensor 100 and grounded neutral sensor 102. As shown in FIG. 1, the outputs of sensor 100 and sensor 102 are coupled to detector 104. The detector 104 out put (pin 7) is connected to the control input of silicon controlled rectifier (SCR) SCR 106. The wiring device 10 includes a tripping mechanism that includes ground fault sensor 100 and grounded neutral sensor 102 coupled to detector 104. Detector 104 is coupled to silicon controlled rectifier (SCR) 106 which is controlled by detector 104 in accordance with sensor (100, 102) outputs. SCR 106 is coupled to solenoid 52. Solenoid 52 is energized when SCR 106 is turned ON by detector 104. A plunger disposed in solenoid 52 engages latch mechanism 80 to thereby open the contacts in contact assembly 15. Contact assembly 15 is disposed between line terminals (20, 200), and load terminals (30, 300) and receptacle load terminals (42, 48). Contact assembly 15 is configured to establish electrical connectivity between the line terminals (20, 200), and load terminals (30, 300) and receptacle load terminals (42, 48) when latch mechanism 80 is in a reset state. Contact assembly 15 is configured to disconnect the line terminals (20, 200) from the load terminals (30, 300) and receptacle load terminals (42, 48) when latch mechanism 80 is in a tripped state.

With regard to contact mechanism 15, neutral line terminal 20 is connected to contact member 24 and contact member 28. Contact members 24 and 28 are operatively coupled to latch mechanism 80. In other words, contact member 24 connects neutral line terminal 20 to neutral load feed-through terminal 30 and contact member 28 connects neutral line terminal 20 to neutral receptacle contact 42 when the latch mechanism 80 is disposed in the reset position. The connectivity is established when contact member 24 is in electrical continuity with contact 32 and contact member 28 in electrical continuity with contact member 46. On the other hand, when solenoid 52 drives latch mechanism 80 into the tripped position, contact members 24 and 28 are deflected to break electrical connectivity with contacts 32 and 46, respectively.

The moveable contact assembly in the hot conductive path is identical. Moveable contact members 240 and 280 mate with fixed contacts 320 and 460 respectively. In doing so, they electrically couple/decouple the hot line terminal 200 to hot load feed-through terminal 300 and neutral receptacle contact 48 depending on whether the latch mechanism 80 is in the reset state or in the tripped state.

The contact assembly 15 shown in FIG. 1 is representative of what is commonly referred to as a four-pole contact mechanism. It will be apparent to those of ordinary skill in the pertinent art that contact assembly 15 of the present invention may be of any suitable type depending on the characteristics of the mechanical implementation of the device. For example, contact assembly 15 may employ a cantilevered contact assembly, a bridge structure, a bus bar arrangement, solid state devices, or any suitable contact mechanism. In a four-pole arrangement, the receptacle load terminals and the feed-through terminals are electrically isolated from each other in the tripped state, as well as being disconnected from the line terminals.

The contact assembly 15 of the present invention may also be implemented as, what is commonly referred to, a two-pole mechanism. In a two-pole embodiment, contact assembly 15 is similar to the above description except that each of the contact pairs 28 and 46, and 280 and 460 are replaced by a non-interruptible conductive path. As such, receptacle terminal 42 is directly and uninterruptedly connected to load terminal 30. This connection is represented by dotted line 43. Likewise, receptacle terminal 48 is directly and uninterruptedly connected to load terminal 300. This connection is represented by dotted line 49. As those of ordinary skill in the art will appreciate, in a two-pole arrangement, while the receptacle load terminals and the feed-through terminals are disconnected from the line in the tripped state, they are not electrically isolated from each other in the tripped state.

The contact assembly 15 of the present invention may also be implemented as, what is commonly referred to, a three-pole mechanism. In a three-pole embodiment, contact assembly 15 is similar to the above description except that either contact pair 28 and 46, or 280 and 460 are replaced by a non-interruptible conductive path. As such, either receptacle terminal 42 is directly and uninterruptedly connected to load terminal 30 by way of dotted line 43, or receptacle terminal 48 is directly and uninterruptedly connected to load terminal 300 by way of dotted line 49. As those of ordinary skill in the art will appreciate, while the receptacle load terminals and the feed-through terminals are disconnected from the line in the tripped state, power cannot be provided from the load terminals to the feed-through load terminals in the tripped state in a three-pole arrangement.

Device 10 also includes a reset mechanism 60 coupled to latch mechanism 80. As briefly noted above, latch 80 is driven into the tripped state by solenoid 52. Once the fault is cleared and the user recognizes that the device 10 has tripped, the user presses the reset button 60 to restore service. When reset button 60 is actuated, latch mechanism 80 closes, or permits the closure of the contacts disposed in contact assembly 15 to restore AC power to the receptacle load and feed-through load.

Device 10 includes an electronic TEST button 50. Latch mechanism 80 is driven into the tripped position when test button 50 is depressed by a user, if device 10 is operating properly. In particular, as the schematic of FIG. 1 suggests, a differential current simulating a ground fault is generated when the electrical TEST button 50 is actuated by the user. Trip solenoid 52 is fired when sensor 100 and detector 104 detect a fault condition. In response thereto, the contacts 32, 46, 320, and 460 open, disconnecting the line, load, and receptacle contacts.

The present invention also includes a trip indicator circuit 130. When device 10 is tripped, trip indicator 130 is activated. Trip indicator 130 includes components R9, R13, R14, and D1 (LED) which are connected in parallel with switch S5. When device 10 is tripped, LED D1 is illuminated. However, when the contacts are reset, there is no potential difference across the LED and D1 is not illuminated. Those of ordinary skill in the art will recognize that indicator 130 may include an audible annunciator as well as an illumination device.

One feature of the present invention relates to the separate EOL functionality disposed in end-of-life (EOL) circuit 120. EOL circuit 120 includes resistors R19-R25, test button 50, SCR Q4, and diode D5. Resistors R20-R22 and SCR Q4 form a latch circuit. R21 and R22 are arranged in a voltage divider configured to control the operation of Q4. R23 and R24 are coupled to Q4. R23 and R24 are surface-mounted fusible resistors that control the activation of the EOL mechanism.

The user pushes the TEST button 50 when the GFCI is reset to generate a simulated fault through R25. Concurrently, 120V AC power is applied to fusible resistor R21. If the GFCI is operating properly, sensor 100, detector 104, and other GFCI circuitry will respond to the simulated fault and trip latch mechanism 80 within about 25 milliseconds. The simulated fault current flowing through R25 is terminated even if TEST button 50 is still being pushed. As the same time, power is removed from resistor R21.

If the GFCI circuitry is not operating properly, it will fail to trip in the manner described above. In response to the continuous application of AC power, the resistance of fusible R21 increases significantly changing the value of the R21/R22 voltage divider. In turn, the voltage across R20 and R19 becomes sufficient to turn Q4 ON, and current begins to flow through resistors R23 and R 24. The resistance values of resistors R23 and R24 increase when power is continuously applied for a sufficient duration. The values will increase from several kilo-ohms to values that are typically greater than 10 meg-ohms. Subsequently, R23 and R24 begin to overheat and the solder that secures R23 and R24 to printed circuit board 12 fails. After the solder melts, resistors R23 and R24 are displaced, actuating EOL contacts 121. When the temperature of resistors R23, R24 is greater than the threshold, the line terminals (20, 200) are decoupled from the feed-through load terminals (30, 300) and the receptacle load terminals (42, 48), independent of the state of circuit interrupting contacts 15.

Those of ordinary skill in the art will appreciate that because resistors R23, R24 are disposed in parallel, they heat independently. Resistor R23 is configured to open one of the EOL contacts 121, while resistor R24 is configured to independently open the other. In an alternate embodiment of the present invention, a single fusible resistor is configured to heat and open both EOL contacts 121.

In an alternate embodiment, device 10 may include TEST button 50' disposed between the power supply and the control input of SCR 106. When button 50' is depressed, SCR 106 is turned ON and device 10 is tripped. As such, TEST button 50' checks the operability of SCR 106 and solenoid 52, but not the operability of sensors 100, 102 or detector 104. The test signal generated by TEST button 50' is not a simulation of an external fault condition. Switch 50' simply initiates a current to turn SCR 106 ON. If the SCR 106 turns ON and causes the trip mechanism to operate, the EOL 120 mechanism is not actuated. If the trip mechanism does not operate, EOL 120 will operate.

Figure 5:
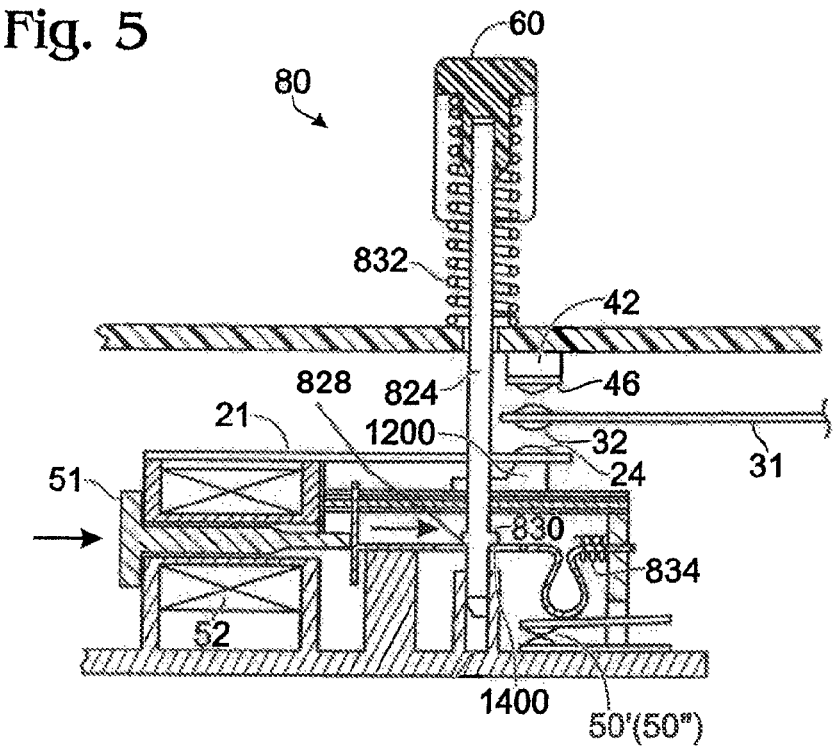
FIG. 5 is another view of the latch mechanism of FIG. 4.
Figure 6:
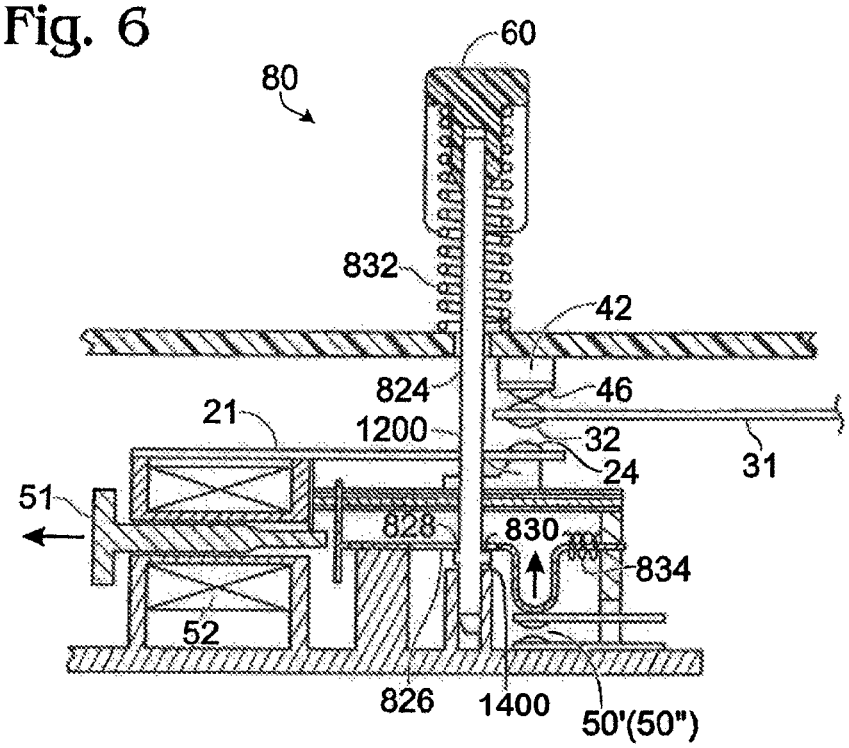
FIG. 6 is yet another view of the latch mechanism of FIG. 4.

As shown in FIG. 1, the test button 50 and reset button 60 are separate, user accessible buttons. In an alternative embodiment, the test functionality may be incorporated into reset button 60 to create a unitized reset/test button. FIGS. 4-6, described in detail below, provide a mechanical implementation of the combined reset/test button. In FIGS. 4-6, test contacts 5" are coupled to the reset button, and hence, are not directly accessible to the user. However, test contacts 50" are closed when the unitized button is actuated. On one hand, if device 10 is in the tripped state, the unitized button 60 may be depressed and released to reset the circuit interrupting contacts 15 in the manner previously described. Before the device is reset, test contacts 50" are closed to activate a test cycle. If the protective device is operational, the circuitry functions normally and the EOL mechanism 120 is not actuated. However, if device 10 is experiencing an EOL condition, the EOL mechanism 120 is actuated, and the load terminals are permanently disconnected from the line terminals. The EOL determination is made each time the unitized button is actuated, whether to reset the device or to test the device already in the reset state. The periodic testing of the device is typically required to be performed on a monthly basis or before each use of the device. Those skilled in the art will also appreciate that the test button 50' (shown in FIG. 1) may also be incorporated into the unitized structure.

As embodied herein and depicted in FIG. 2, a perspective view of the EOL mechanism 120 shown in FIG. 1 is disclosed. Resistors R23 and R24 are soldered to the underside of printed circuit board (PCB) 12. Openings are disposed in PCB 12 in alignment with resistors R23 and R24. Resistors R23 and R24 prevent spring loaded plungers 122 from extending through the openings 126 in board 12. Each plunger 122 is configured to support an electrically connecting bus-bar member 124. Each bus-bar 124 couples a line terminal (20, 200) to the contact assembly 15. As described above, when the solder supporting R23 and R24 melts, spring loaded plungers 122 are driven through the holes, breaking the connections between the line and load terminals. Once this occurs, there is no mechanism for resetting the device. Accordingly, the device must be replaced. In an alternate embodiment, resistors R23, R24 are configured to melt and "burn" open. The result is similar. Spring-loaded plungers 122 are driven through the holes, breaking the connections between the line and load terminals.

In an alternate embodiment, the EOL mechanism is a single pole mechanism which interrupts electrical connectivity either to line terminal 20 or line terminal 200 (not shown.) As those of ordinary skill in the art will appreciate, in a single-pole arrangement, the opening of the single pole serves to deny power conveyance from the line to the load.

In yet another alternate embodiment, the end of life mechanism is disposed between the load terminals and the circuit interrupter as a double pole mechanism. One pole interrupts electrical connectivity between a line terminal and a corresponding feed-through terminal in response to an end of life condition. The other pole interrupts electrical connectivity between the line terminal and a corresponding receptacle terminal in response to the end of life condition.

Figure 3:
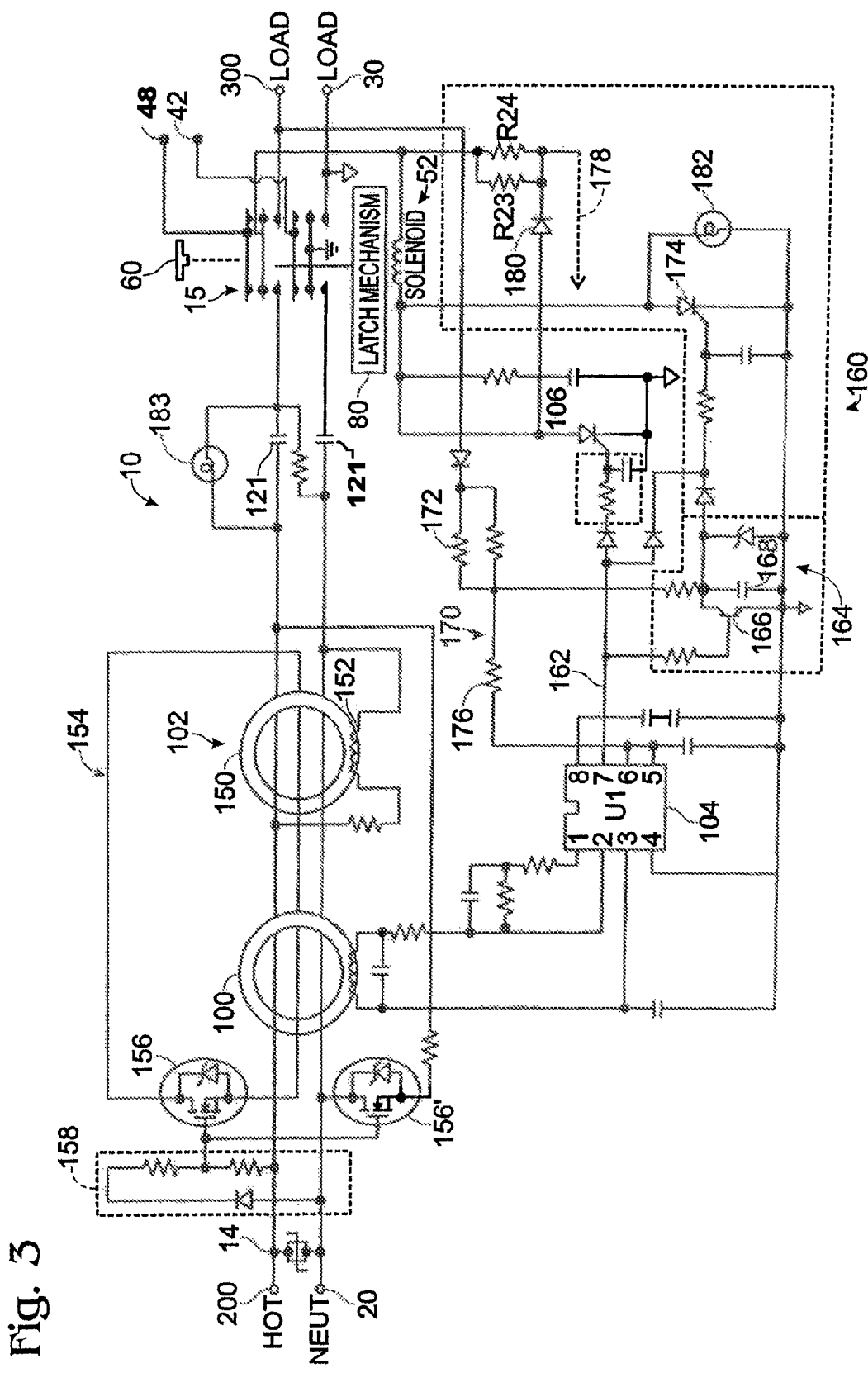
FIG. 3 is a schematic of the electrical device in accordance with a second embodiment of the present invention.

Referring to FIG. 3, an alternate schematic of the electrical device of the present invention is disclosed. This embodiment combines an auto-test circuit with an end-of-life circuit. This design may be employed in conjunction with any of the embodiments of the invention. This circuit is similar to the circuit depicted in FIG. 1, and the end-of-life circuit/mechanism is similar to that shown above.

Device 10 includes hot line contact 200 and neutral line contact 20 coupled to ground fault sensor 100 and grounded neutral sensor 102. The ground fault sensor 100 and grounded neutral sensor 102 are coupled to detector 104. Grounded neutral sensor 102 includes a saturating core 150 and a winding 152 coupled to hot and neutral line terminals 200 and 20, respectively. Those of ordinary skill in the art will recognize that it is typical practice to intentionally ground neutral line terminal 20 at the service panel of the electrical distribution system. During a true grounded neutral condition, neutral load terminal 30 is inadvertently grounded.

A grounded neutral fault condition, and the resulting path through ground by way of terminals 20 and 30, may be simulated by electrical loop 154. When electrical loop 154 is closed, saturating core 150 induces current spikes in the electrical loop 154. Reversals in the magnetic field in core 150 corresponded to the zero crossings in the AC power source. The reversals in the magnetic field generate current spikes. Current spikes occurring during the negative-transitioning zero crossings produce a signal during the negative half cycle portions of the AC power source. The signal is sensed as a differential signal by ground fault sensor 100, and detected by ground fault detector 104. In response, SCR 106 enables solenoid 52 to trip latch mechanism 80.

The simulated grounded neutral condition is enabled when switch 156 turns ON, to thereby close electrical loop 154. Control circuit 158 turns switch 156ON during the negative half cycle. Thus, the current spikes occur during the negative half cycle portions but not during the positive half cycle portions of the AC power signal. Note that while output 162 of ground fault detector 104 attempts to actuate SCR 106, it cannot do so because SCR 106 is reverse biased during the negative half cycle. As a result, the simulated fault test is unable to turn SCR 106ON. However, output signal 162 from ground fault detector 104 is used by EOL checking circuit 160 to determine whether or not an end of life condition has occurred. In response to a true ground fault or grounded neutral condition, ground fault detector 104 signals SCR 106 to actuate solenoid 52 to trip the latch mechanism 80 during the positive half cycle portions of AC power source.

In an alternate embodiment, device 10 includes switch 156' as a means for automatically simulating a ground fault. Device 10 may incorporate one or both of these testing features. The ground fault test likewise occurs during the negative half cycles of the AC power source. Those skilled in the art are familiar with any number of simulated signals that may be used by the EOL circuit to determine the operative status of the device.

It will be apparent to those of ordinary skill in the pertinent art that any suitable device may be employed to implement switch 156 (156'). For example, switch mechanisms 156 (156') may be implemented using a MOSFET device, such as the device designated as MPF930 and manufactured by ON Semiconductor. In another embodiment, switch 156 (156') may be monolithically integrated in the ground fault detector 104.

When a simulated grounded neutral condition is introduced in the manner described above, a test acceptance signal is provided to delay timer 164 during the negative half cycle portions of the AC power source. Delay timer 164 includes a transistor 166 that discharges capacitor 168 when the test acceptance signal is received. Capacitor 168 is recharged by power supply 170 by way of resistor 172 during the remaining portion of the AC line cycle. Again, if there is an internal failure in GFCI 10, the test acceptance signal will not be generated and transistor 166 will not be turned ON. As a result, capacitor 168 continues to charge until it reaches a predetermined voltage. At the predetermined voltage, SCR 174 is activated during a positive half cycle portion of the AC power source signal. In response, solenoid 52 drives latch mechanism 80 into the tripped state.

Note that both ground fault detector 104 and checking circuit 160 derive power from power supply 170. Redundant components may be added such that if one component has reached end of life, another component maintains the operability of ground fault detector 104, thereby enhancing reliability, or at least assuring the continuing operation of the checking circuit 160. For example, resistor 172 in power supply 170 may be equipped with parallel resistors. As another example, resistor 176 may be included to prevent the supply voltage from collapsing in the event the ground fault detector 104 shorts out. Clearly, if the supply voltage collapses, delay timer 168 may be prevented from signaling an end of life condition. The present invention should not be construed as being limited to the aforementioned examples as those of ordinary skill in the art will recognize that there are a number of redundant components that can be included in device 10.

Checking circuit 160 is ineffectual if latch mechanism 80 and/or solenoid 52 is experiencing an end of life condition. For example, solenoid 52 may have an electrical discontinuity. This failure mode may be obviated by the present invention by connecting SCR 174 to end-of-life resistors R23, R24 instead of being connected to solenoid 52. This embodiment is shown by dotted line 178. Of course, EOL resistors R23, R24 have been previously described. At end of life, SCR 174 conducts current through R23, R24 to cause them to fail, causing EOL contacts 121 to permanently disconnect the line terminals from the load terminals.

Dislodging of resistors R23, R24 results in a permanent decoupling of the load side of device 10 from the AC power source. Accordingly, it is important that the dislodgement (or burn out) of the resistors only occur in response to a true EOL condition, and not due to some spurious circumstance, such as transient electrical noise. For example, SCR 174 may be turned ON in response to a transient noise event. However, coupling diode 180 may be included to decouple resistor R23, R24 in the event of a false EOL condition. When SCR 174 is ON, coupling diode 180 allows SCR 174 to activate solenoid 52. Latch mechanism 80 trips, whereupon resistors R23, R24 are decoupled from the AC power source. As in the previous embodiment, device 10 includes a trip indicator 182, which may be an audible and/or visible indicator.

The present invention may include an EOL indicator that is activated when device 10 has reached end-of-life. EOL indicator 183 is disposed across contacts 121. Of course, there is no potential difference between contacts 121 before an end-of-life condition has occurred. However, when contacts 121 open in response to an end-of-life condition, EOL indicator 183 is activated. Those of ordinary skill in the art will recognize that indicator 183 may include an audible annunciator as well as an illumination device. Indicator 183 emits a steady output at end-of-life, or a non-steady output such as a beeping sound or a flashing light.

Referring to FIG. 4, a detail view of latching mechanism 80 in accordance with one embodiment of the present invention is disclosed. In FIG. 4, contact 24, disposed on neutral line cantilever 21, is separated from dual load cantilever contact 32, and fixed receptacle contact 46 in a tripped state. Of course, neutral line cantilever 21 is coupled to neutral line terminal 20. Dual load cantilever contact 32 is connected to cantilever 31, which in turn is connected to neutral feed-through terminal 30. Reset is effected by applying a downward force to reset button 60. Shoulder 1400 on reset pin 824 bears downward. In the embodiment depicted in FIG. 4, TEST contacts 50' (50") are shown. Those of ordinary skill in the art will recognize that latch mechanism 80 and reset mechanism 60 may be implemented without incorporating test contacts 50' (50"). However, in FIG. 4, pin 824 bears down on switch 50'(50") to effect a TEST cycle.

In FIG. 5, neutral line contact 24, load contact 32, and fixed receptacle contact 46 are still separated. On the other hand, switch 50' (50") is fully closed to generate the simulated fault condition. The simulated fault signal is sensed and detected, causing solenoid 52 to activate armature 51. Armature 51 moves in the direction shown, permitting hole 828 in latch 826 to become aligned with shoulder 1400. The downward force applied to unitized button 60 causes shoulder 1400 to continue to move downward, since it is no longer restrained by shoulder 1400.

Referring to FIG. 6, since shoulder 1400 is disposed beneath latch 826, it is no longer able to apply a downward force on latch 826. Accordingly, switch 50' (50") opens causing the TEST signal to cease. As a result, solenoid 52 is de-energized. Armature 51 moves in the direction shown in response to the biasing force of spring 834 and latch 826 is seated on latching escapement 830. In FIG. 6, the motion is shown in mid-process, i.e., contact 24 and 32 are not yet closed; however, device 10 is ultimately fully reset, closing contacts 24, 32, and 46. Further, the EOL mechanism 120 has not been activated because switch 50' (50") is only closed for the time it takes to trip device 10, i.e., about 25 milliseconds. This is too short a period of time to actuate the EOL mechanism.

On the other hand, if the circuitry of protective device 10 is experiencing an EOL condition, armature 51 fails to move in response to closure of switch 50' (50"). Shoulder 1400 continues to maintain closure of switch 50' (50") for a duration substantially greater than the expected trip time of the device, i.e., at least 500 milliseconds. Accordingly, the EOL mechanism 120 is configured to activate in the manner previously described. If the latch mechanism 80 of protective device 10 is experiencing an EOL condition, for example, the immobilization of armature 51 or latch 826 as the result of dirt or corrosion, switch 50'(50") will remain closed for a duration substantially greater than the expected trip time of the device. Accordingly, device 10 is responsive to EOL conditions in the GFCI circuitry as well as mechanical EOL conditions.

If switch 50' (50") is provided, the latch mechanism 80 may be tripped by way of a user accessible button (not shown) that is coupled to latch 826. When the button is depressed, latch 826 moves in the direction shown in FIG. 5 thus causing the mechanism to trip. As has been described above, resetting of latch mechanism 80 may then be accomplished by depressing reset button 60.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A protective wiring device for use in an electrical distribution system, the device comprising:
    a plurality of line terminals;
    a plurality of load terminals configured to be coupled to the plurality of line terminals in a reset state;
    a detector circuit coupled to the plurality of line terminals, the detector circuit being configured to generate a detection signal in response to detecting at least one predefined perturbation in the electrical distribution system;
    a circuit interrupter assembly coupled between the plurality of line terminals and the plurality of load terminals, the circuit interrupter assembly being configured to decouple the plurality of line terminals from the plurality of load terminals in response to the detection signal; and
    an end-of-life mechanism coupled to the detector circuit, the end-of-life mechanism being configured to permanently decouple the plurality of line terminals from the plurality of load terminals independently from the circuit interrupter in the absence of an intervening signal.

2. The device of claim 1, wherein the end-of-life mechanism further comprises:
    a test circuit coupled to the detector circuit, the test circuit being configured to generate a test signal; and
    a checking circuit coupled to the detector circuit, the checking circuit being configured to generate the intervening signal in response to the detection signal.

3. The device of claim 2, wherein the test signal simulates the at least one predefined perturbation.

4. The device of claim 2, wherein the test signal is a periodic signal.

5. The device of claim 4, wherein the test signal occurs during a predetermined polarity of a source voltage propagating in the electrical distribution system.

6. The device of claim 2, wherein the test signal is automatically generated by the test circuit.

7. The device of claim 2, wherein the test circuit is configured to generate the test signal in response to a user stimulus.

8. The device of claim 7, wherein the test signal simulates the at least one predefined perturbation.

9. The device of claim 7, wherein the test signal does not simulate the at least one predefined perturbation.

10. The device of claim 1, wherein the end-of-life mechanism includes:
    a timer circuit that is configured to generate an end-of-life enable signal after a predetermined period of time elapses, the timer circuit being reset by the intervening signal;
    at least one fusible resistor being configured to conduct an electrical current in response to the end-of-life enable signal, the at least one fusible resistor being configured to open a predetermined period of time after conducting the electrical current;
    a spring member coupled to the at least one fusible resistor, the spring member being compressed by the at least one fusible resistor when in a closed state, the spring member also being released in response to the at least one fusible resistor being opened; and
    end of life contacts coupled between at least one of the plurality of line terminals and at least one of the plurality of load terminals, the end of life contacts being configured to permanently decouple the plurality of line terminals from the plurality of load terminals in response to the spring member being released.

11. The device of claim 10, wherein the at least one fusible resistor is held in place by a material, the material being configured to melt in response to the electrical current.

12. The device of claim 11, wherein the material includes a solder or an adhesive.

13. The device of claim 10, wherein the at least one fusible resistor is configured to burn open in response to thermal energy generated by the electrical current.

14. The device of claim 1, wherein the at least one predefined perturbation is representative of a ground fault, a grounded neutral, and/or an arc fault.

15. The device of claim 1, further comprising an indicator coupled to the end-of-life mechanism, the indicator being energized in response to the end-of-life mechanism permanently decoupling at least one of the plurality of line terminals from at least one of the plurality of load terminals.

16. The device of claim 1, further comprising:
a test circuit coupled to at least one of the detector circuit, the test circuit being configured to generate a test signal simulating the at least predefined perturbation; and
a circuit element coupled between the end-of-life mechanism and the plurality of load terminals, the circuit element being configured to transmit an AC power signal or the intervening signal from the plurality of load terminals to the end-of-life mechanism, the intervening signal being substantially equal to zero volts.

17. The device of claim 16, wherein the end of life mechanism further comprises:
at least one fusible resistor coupled to the test circuit and configured to conduct an electrical current in response to the test signal, the at least one fusible resistor being configured to open a predetermined period of time after conducting the electrical current;
a spring member coupled to the at least one fusible resistor, the spring member being compressed by the at least one fusible resistor when in a closed state, the spring member also being released in response to the at least one fusible resistor being opened; and
end of life contacts coupled between at least one of the plurality of line terminals and at least one of the plurality of load terminals, the end of life contacts being configured to permanently decouple the at least one of the plurality of line terminals from the at least one of the plurality of load terminals in response to the spring member being released.

18. The device of claim 17, wherein the test signal is generated by a user stimulus.

19. The device of claim 17, wherein the at least one fusible resistor is held in place by a material, the material being configured to melt in response to the electrical current.

20. The device of claim 19, wherein the material includes a solder or an adhesive.

21. The device of claim 17, wherein the at least one fusible resistor is configured to burn open in response to thermal energy generated by the electrical current.

22. The device of claim 16, wherein the circuit interrupter further includes a reset mechanism coupled to the test circuit, and wherein the test circuit includes test switch contacts, the reset mechanism being configured to close the test switch contacts in response to a user stimulus.

23. The device of claim 22, wherein the reset mechanism further comprises a mechanical barrier coupled to the test switch contacts, the mechanical barrier being decoupled from the test switch contacts when the circuit interrupter is tripped, whereby the test signal is discontinued.

24. The device of claim 1, further comprising:
a test circuit coupled to the detector, the test circuit being configured to generate a test signal simulating the at least one predefined perturbation in response to an actuation signal; and
a unitary user input mechanism coupled to the test circuit, the unitary user input mechanism being configured to generate the actuation signal in response to a user stimulus and reset the circuit interrupter assembly in response to a removal of the user stimulus if the circuit interrupter is in a tripped state, the tripped state being indicative of the intervening signal.

25. The device of claim 24, wherein the end of life mechanism permanently decouples the plurality of line terminals from the plurality of load terminals if the circuit interrupter remains in the reset state, the reset state being indicative of the absence of the intervening signal.

26. The device of claim 1, further comprising a user actuated test mechanism configured to generate a test signal in response to a user stimulus, the test signal simulating the detection signal, whereby the circuit interrupter assembly is tripped in response thereto if the device is operational, a tripped state being indicative of the intervening signal.

27. The device of claim 26, wherein the end of life mechanism permanently decouples at least one of the plurality of line terminals from at least one of the plurality of load terminals if the circuit interrupter remains in the reset state, the reset state being indicative of the absence of the intervening signal.

28. The device of claim 1, wherein the end-of-life mechanism is coupled to the circuit interrupter assembly such that the permanently decoupling is prevented whenever the circuit interrupter has decoupled the plurality of line terminals from the plurality of load terminals.

29. A protective wiring device for use in an electrical distribution system, the device comprising:
at least one line terminal;
at least one load terminal configured to be coupled to the line terminal in a reset state;
a detector circuit coupled to the at least one line terminal, the detector circuit being configured to generate a detection signal in response to detecting at least one predefined perturbation in the electrical distribution system;
a circuit interrupter assembly coupled between the at least one line terminal and the at least one load terminal, the circuit interrupter assembly being configured to decouple the at least one line terminal from the at least one load terminal in response to the detection signal;
an end-of-life mechanism coupled to the detector circuit, the end-of-life mechanism being configured to permanently decouple the at least one line terminal from the at least one load terminal independently from the circuit interrupter assembly in the absence of an intervening signal;
a test circuit coupled to the detector circuit, the test circuit being configured to generate a test signal, the test signal simulating the at least one predefined perturbation; and
a checking circuit coupled to the detector circuit, the checking circuit being configured to generate the intervening signal in response to the detection signal.

30. A protective wiring device for use in an electrical distribution system, the device comprising:
at least one line terminal;
at least one load terminal configured to be coupled to the line terminal in a reset state;
a detector circuit coupled to the at least one line terminal, the detector circuit being configured to generate a detection signal in response to detecting at least one predefined perturbation in the electrical distribution system;
a circuit interrupter assembly coupled between the at least one line terminal and the at least one load terminal, the circuit interrupter assembly being configured to decouple the at least one line terminal from the at least one load terminal in response to the detection signal;

an end-of-life mechanism coupled to the detector circuit, the end-of-life mechanism being configured to permanently decouple the at least one line terminal from the at least one load terminal independently from the circuit interrupter assembly in the absence of an intervening signal;

a test circuit coupled to the detector circuit, the test circuit being configured to generate a test signal simulating the at least one predefined perturbation; and a circuit element coupled between the end-of-life mechanism and the at least one load terminal, the circuit element being configured to transmit the intervening signal from the at least one load terminal to the end-of-life mechanism, the intervening signal being substantially equal to zero volts.

31. A protective wiring device for use in an electrical distribution system, the device comprising:

at least one line terminal;

at least one load terminal configured to be coupled to the at least one line terminal in a reset state;

a detector circuit coupled to the at least one line terminal, the detector circuit being configured to generate a detection signal in response to detecting at least one predefined perturbation in the electrical distribution system;

a circuit interrupter assembly coupled between the at least one line terminal and the at least one load terminal, the circuit interrupter assembly being configured to decouple the at least one line terminal from the at least one load terminal in response to the detection signal;

an end-of-life mechanism coupled to the detector circuit, the end-of-life mechanism being configured to permanently decouple the at least one line terminal from the at least one load terminal independently from the circuit interrupter assembly in the absence of an intervening signal;

a test circuit coupled to the detector, the test circuit being configured to generate a test signal simulating the at least one predefined perturbation in response to an actuation signal; and a unitary user input mechanism coupled to the test circuit, the unitary user input mechanism being configured to generate the actuation signal in response to a user stimulus and reset the circuit interrupter assembly in response to a removal of the user stimulus if the circuit interrupter is in a tripped state, the tripped state being indicative of the intervening signal.

32. The device of claim 31, wherein the end of life mechanism permanently decouples the plurality of line terminals from the plurality of load terminals if the circuit interrupter remains in the reset state, the reset state being indicative of the absence of the intervening signal.

33. A protective wiring device for use in an electrical distribution system, the device comprising:

a plurality of line terminals;

a plurality of load terminals configured to be coupled to the plurality of line terminals in a reset state;

a detector circuit coupled to the plurality of line terminals, the detector circuit being configured to generate a detection signal in response to detecting at least one predefined perturbation in the electrical distribution system;

a circuit interrupter assembly coupled between the plurality of line terminals and the plurality of load terminals, the circuit interrupter assembly being configured to decouple the plurality of line terminals from the plurality of load terminals in response to the detection signal;

an end-of-life mechanism coupled to the detector circuit, the end-of-life mechanism being configured to permanently decouple the at least one line terminal from the at least one load terminal independently from the circuit interrupter assembly in the absence of an intervening signal; and a user actuated test mechanism configured to generate a test signal in response to a user stimulus, the test signal simulating the detection signal, whereby the circuit interrupter assembly is tripped in response thereto if the device is operational, a tripped state being indicative of the intervening signal.

34. The device of claim 33, wherein the end of life mechanism permanently decouples the plurality of line terminals from the plurality of load terminals if the circuit interrupter remains in the reset state, the reset state being indicative of the absence of the intervening signal.

* * * * *